(12) United States Patent
Isa

(10) Patent No.: US 6,959,485 B2
(45) Date of Patent: Nov. 1, 2005

(54) BUMP BALL CRIMPING APPARATUS

(75) Inventor: Yukihiro Isa, Tateyama (JP)

(73) Assignee: UMC Japan, Chiba Ken (JP)

( * ) Notice: Subject to any disclaimer, the term of this patent is extended or adjusted under 35 U.S.C. 154(b) by 188 days.

(21) Appl. No.: 10/683,685

(22) Filed: Oct. 10, 2003

(65) Prior Publication Data

US 2004/0089697 A1    May 13, 2004

(30) Foreign Application Priority Data

Nov. 8, 2002    (JP) .............................. 2002-325430

(51) Int. Cl.$^7$ .............................................. B23P 21/00

(52) U.S. Cl. ...................... 29/709; 29/759; 29/407.09; 29/407.1; 29/464; 29/468; 29/281.1; 29/281.4; 29/559; 269/289 R

(58) Field of Search ............................... 29/592.1, 825, 29/407.01, 407.09, 407.1, 464, 466, 468, 29/525.13, 559, 709, 714, 721, 759, 760, 29/281.1, 281.4, 840; 269/54.4, 55, 58, 59, 269/289 R, 909; 228/41, 246, 180.22

(56) References Cited

U.S. PATENT DOCUMENTS 5,831,247 A * 11/1998 Hidaka ........................ 219/388

FOREIGN PATENT DOCUMENTS

| JP | 9-82748 | | 3/1997 | |
| JP | 11243105 A | * | 9/1999 | ........... H01L 21/60 |

* cited by examiner

Primary Examiner—Jermie E. Cozart
(74) Attorney, Agent, or Firm—Cohen, Pontani, Lieberman & Pavane

(57) ABSTRACT

The bump ball crimping apparatus of the present invention is characterized in comprising an alignment plate 31 for aligning bump balls; a crimping table 32 on which the wafer to which bump balls are to be crimped is mounted; a crimping plate 42 that crimps the bump balls onto the bonding pads of the wafer; a Y-axis moving mechanism 35 that can move the alignment plate 31 in the Y direction and can fasten it at a predetermined position; an X-axis moving mechanism that can move the alignment plate 31 in the X direction and can fasten it at a predetermined position; and a second Y-axis moving mechanism 37 that can move the crimping table 32 in the Y direction and can fasten it at a predetermined position.

14 Claims, 7 Drawing Sheets

BUMP BALL CRIMPING APPARATUS

BACKGROUND OF THE INVENTION

1. Field of the Invention

The present invention relates to a bump ball crimping apparatus, and in particular, to a bump ball crimping apparatus suitable for use when crimping bump balls simultaneously on the bonding pads of a semiconductor device formed on a semiconductor substrate such as a silicon substrate.

2. Background Art

Conventionally, in the manufacturing process of a semiconductor device such as an IC, LSI, or VLSI, a bump ball crimping apparatus is used as an apparatus that forms bump balls simultaneously on the pads of a semiconductor device formed on a semiconductor substrate such as a silicon wafer.

This bump ball crimping apparatus comprises an alignment plate (aligning tool) on which a plurality of bump balls are held by suction on a suction opening; a crimping table (sample table) on which a silicon wafer is mounted, this silicon wafer having formed thereon a plurality of bonding pads disposed below the aligning plate; and a crimping mechanism that crimps the plurality of bump balls disposed above the aligning plate and held by suction to the aligning plate to the bonding pads of the silicon wafer. Up to the present, various apparatuses have been proposed for this bump ball crimping apparatus (for example, refer to: Japanese Unexamined Patent Application, First Publication No. Hei 9-82748).

However, conventional bump ball crimping apparatuses crimp the same number of bump balls held by suction to the alignment plate on from tens of thousands to hundreds of thousands of bonding pads on a silicon wafer mounted on the crimping table. However, because the crimping table interferes with the aligning plate, there is the problem that it is not possible to crimp simultaneously bump balls on the bonding pads of the silicon wafer. Thus, a method has been used wherein a silicon wafer is partitioned into a plurality of small blocks, and bump balls are crimped in each of the small blocks sequentially. However, in this method, there is the problem that variation occurs in the height of the bumps. In addition, because bump balls are crimped on each small block sequentially, the time required for the crimping process becomes long, and the production efficiency deteriorates.

In consideration of the problems described above, it is an object of the present invention to provide a bump ball crimping apparatus that can crimp bump balls simultaneously on the bonding pads of a semiconductor device formed on a semiconductor substrate such as a silicon substrate, shortens the required time for the crimping process, and increases production efficiency.

SUMMARY OF THE INVENTION

In order to solve the problems described above, the present invention uses the following type of structure.

The bump ball crimping apparatus of the present invention comprising an alignment tool for aligning a plurality of bump balls; a sample table disposed below the alignment tool for mounting the plate-shaped samples on which the bump balls are to be crimped; a crimping mechanism disposed above the alignment tool for crimping the bump balls to the plate-shaped samples; and a first moving mechanism disposed below the alignment tool and the sample table that can move the alignment tool in two mutually perpendicular directions on a plane, and can fasten it at a predetermined position, is characterized in comprising a second moving mechanism disposed below the sample table that can move the sample table in at least one direction in the plane parallel to the above two directions, and can fasten it at a predetermined position.

In addition, the present invention is characterized in providing a second moving mechanism that can move the sample table in at least one of the two directions described above, and can fasten it in a predetermined position.

In addition, the second moving mechanism is characterized in being fastened to the first moving mechanism.

In addition, the present invention is characterized in comprising a supply device for supplying bump balls to the alignment tool.

In addition, the present invention is characterized in comprising a detection device for detecting that the plurality of bump balls is aligned on the alignment tool.

In addition, the present invention is characterized in comprising an alignment tool replacing device for automatically replacing the alignment tool.

In addition, the second moving mechanism is characterized in that the sample table is moved between a position overlapping the alignment tool from a horizontal view and a position that does not overlap the alignment tool from a horizontal view.

In addition, the present invention is characterized in that the length of the range of movement of this second moving mechanism is made smaller than the length of the range of movement of the first moving mechanism in a direction identical to the second moving mechanism.

According to the structure described above, it is possible to move the sample table while the alignment tool is fastened, the positioning of the bump balls aligned by the alignment tool and the bump ball crimping apparatus of the plate-shaped samples on the sample table can be easily carried out, and the adjustment between the alignment tool and the sample table can be easily carried out. Therefore, there is no interference between the sample table on which the plate-shaped samples are mounted and the alignment tool.

In addition, the distance between the alignment tool fastened to the first moving mechanism and the sample table fastened to the second moving mechanism can be always constantly maintained due to the second moving mechanism being fastened to the first moving mechanism. Therefore, because these positions are made absolute positions, it is possible to move the sample table on the second moving mechanism independently of the alignment tool, and as a result, it is possible to move the sample table without interfering with the alignment tool.

In addition, by providing an alignment tool replacing device that automatically replaces the alignment tool, it is possible to automatically replace the necessary alignment tool appropriately as necessary, it is possible to prevent insufficient installation precision that occurs during the replacement of the alignment tool, and it is possible to improve the accuracy of the alignment tool of along the top plane.

In addition, as a second moving mechanism, when using a movement stroke that is smaller than that of the first moving mechanism, it is possible to correctly position the sample table with respect to the alignment tool.

EMBODIMENT

An embodiment of the bump ball crimping apparatus of the present invention will be explained with reference to the drawings.

Figure 1:
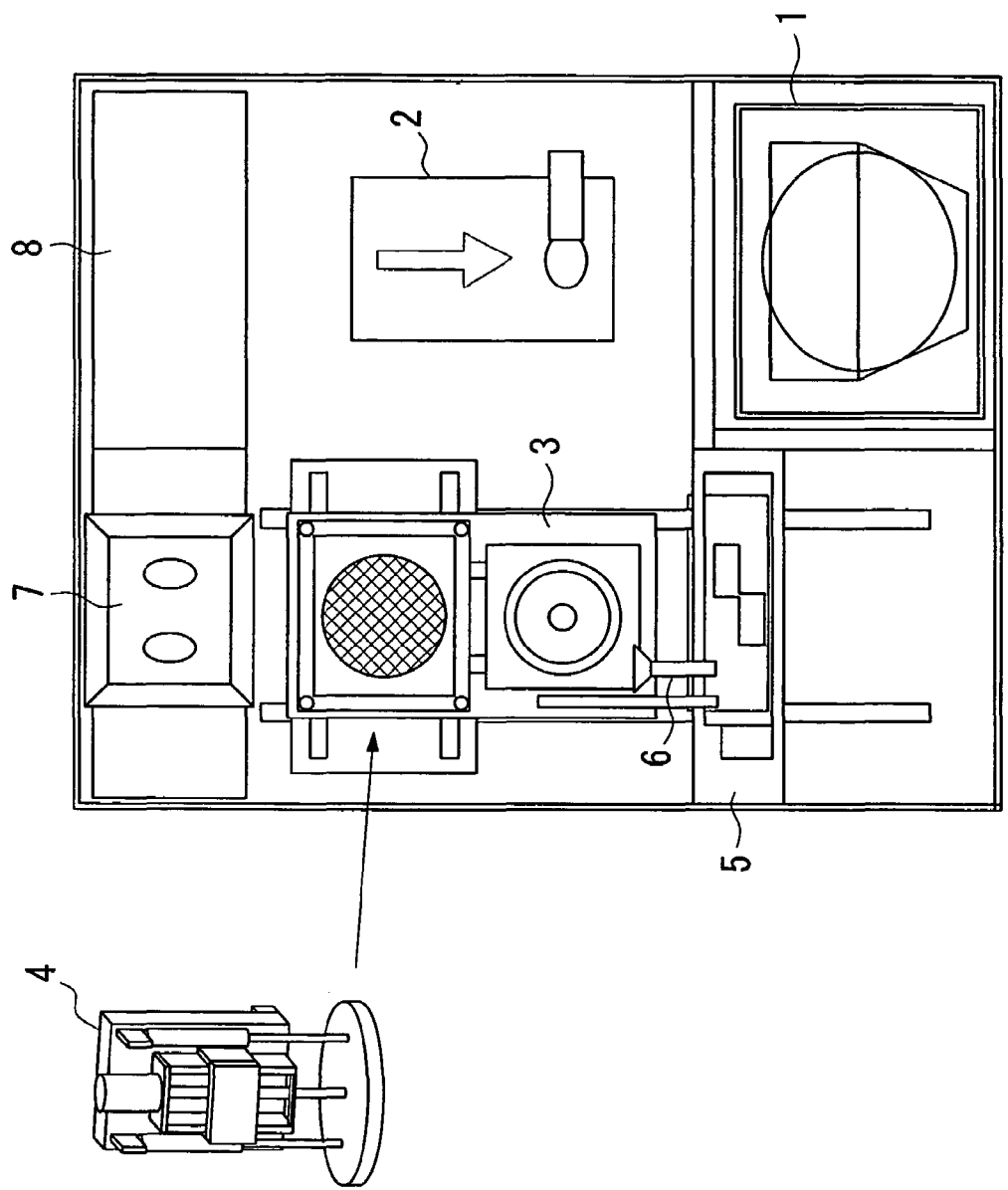
FIG. 1 is a planar drawing showing the entire structure of the bump ball crimping apparatus of an embodiment of the present invention.

FIG. 1 is a planar drawing showing the whole structure of the bump ball crimping apparatus of the present embodiment, and in the figure, reference numeral 1 denotes a cassette set unit, 2 denotes a wafer conveyance unit, 3 denotes a bump ball crimping table unit, 4 denotes a bump ball crimping formation unit (crimping mechanism), 5 denotes an alignment unit, 6 denotes a bump ball feeding unit (supply device), 7 denotes the automatic bump ball alignment plate replacing unit (alignment tool replacing device), and 8 denotes the bump ball alignment plate storage housing.

Figure 2:
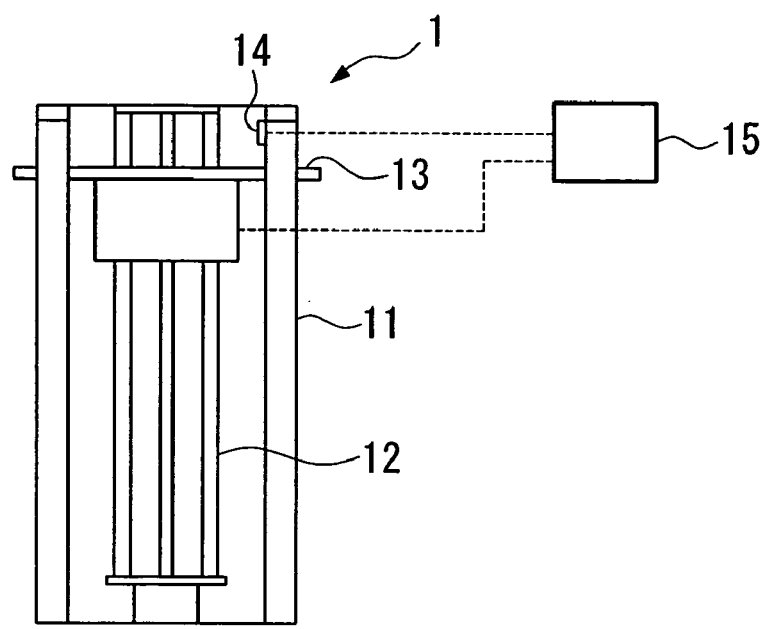
FIG. 2 is a frontal drawing showing a cassette set unit for an embodiment of the bump ball crimping apparatus of the present invention.

The cassette set unit 1 is for providing an elevator function that supports and raises the wafer cassette that stores a plurality of semiconductor wafers (plate-shaped samples such as a silicon wafer, and as shown in FIG. 2, comprises a parallelepiped frame 11, support posts 12 that are erected at the center of the frame, a table 13 for wafer cassette mounting that freely moves in a vertical direction (the Z-axis direction) along the support posts 12 and can be fastened at a predetermined position, a beam interruption sensor 14 that detects the arrangement and number of the wafers inside the cassette when the cassette is lowered by lowering the table 13, and a control unit 15 that controls the action of the whole cassette set unit 1, which includes the table 13 and the beam interruption sensor 14.

Figure 3:
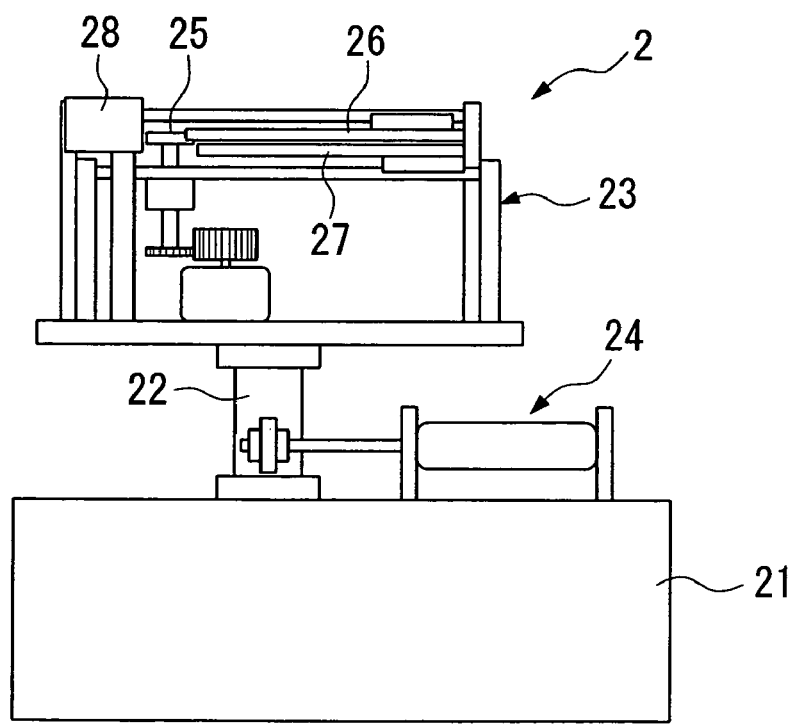
FIG. 3 is a frontal drawing showing a wafer delivery unit for an embodiment of the bump ball crimping apparatus of the present invention.

The wafer conveyance unit 2 is for moving a wafer between the cassette set unit 1 and the bump ball crimping table unit 3, and as shown in FIG. 3, comprises a rotating base 21, a rotating mechanism 24 that is provided on this turning base 21 and rotates the rotating frame 23 around the vertical axle 22, a center chuck table 25 that is provided on a rotating frame 23, maintains the suction on the wafer, and can rotate around the vertical axis, the conveyance arms 26, which are a pair of arms for conveying a wafer while maintaining the suction hold on the wafers, the recovery arms 27 for recovering a wafer, and a detecting sensor 28 for detecting the notch or the orientation flat of the wafer.

Figure 4:
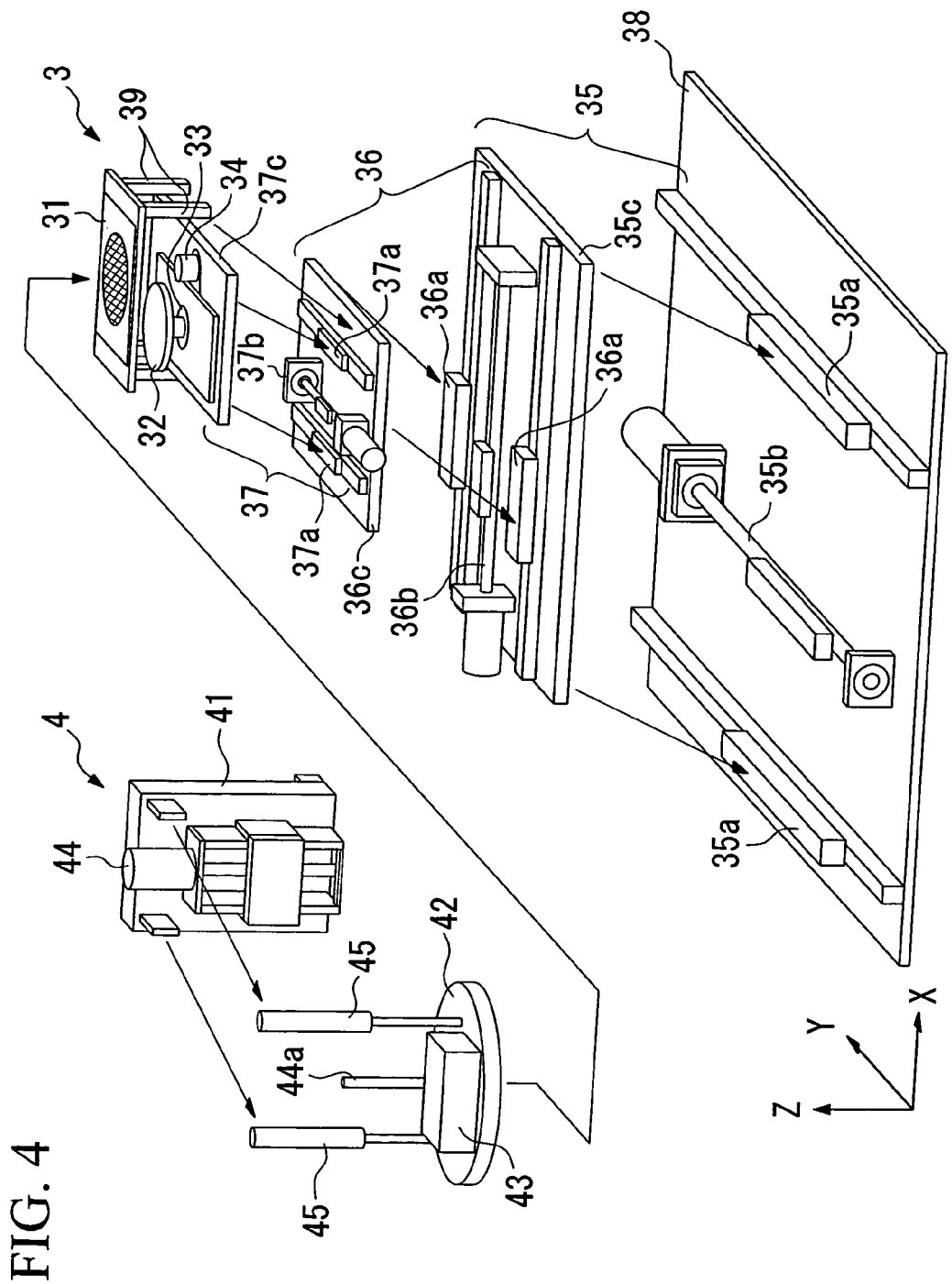
FIG. 4 is an exploded perspective drawing showing a bump ball crimping table unit and a bump ball crimping formation unit for an embodiment of the bump ball crimping apparatus of the present invention.

The bump ball crimping table unit 3 is for disposing a plurality of bump balls that are aligned on the flat surface on each of the bonding pads of the wafer, and as shown in FIG. 4, comprises an aligning plate (alignment tool) 31 having a plurality of alignment holes formed for aligning the plurality of bump balls, a crimping table (sample table) 32 disposed below the alignment plate 31 and having 3 pin wafer transport unit (not illustrated) provided on the upper surface for mounting the wafer on which the bump balls are to be crimped, an θ-axis moving mechanism 33 that rotates the crimping table 32 around the vertical axis, a Z-axis moving mechanism 34 that vertically moves the crimping table 32 by the vertical axis, a Y-axis moving mechanism 35 that can move the alignment plate 31 in the Y-axis direction and fasten it at a predetermined position, an X-axis moving mechanism 36 that can move the alignment plate 31 in the X-axis direction and fasten it at a predetermined position, and a second Y-axis mechanism 37 that can move the crimping table 32 in the Y-axis direction (in at least one direction among two directions) and can fasten it at a predetermined position.

A detecting device (not illustrated) is provided on the bump ball crimping table unit 3 for detecting that bump balls are buried in all alignment holes on the alignment plate 31. This detecting device should be able to detect that bump balls are buried in all of the alignment holes, and for example, a high sensitivity camera employing image recognition technology or a detecting system that uses semiconductor laser (a light emitting element) and a photodiode (light receiving element) can be used.

The Y-axis moving mechanism 35 is provided on the table 38 disposed horizontally, and comprises a pair of long guides 35a and 35a disposed along the Y-axis, a Y-axis moving mechanism 35b that provides a ball screw and a pulse motor, and a plate 35c that can move in the Y-axis direction due to the Y-axis moving mechanism 35b and that can be fastened at a predetermined position.

The X-axis moving mechanism 36 is provided integrally on the Y-axis moving mechanism 35, and comprises a pair of long guides 36a and 36a provided on a plate 35c along the X-axis, an X-axis moving mechanism 36b that provides a ball screw and a pulse motor, and a plate 36c that can move in the X-axis direction due to the X-axis moving mechanism 36b and can be fastened at a predetermined position. On the peripheral edge of this plate 36c, support posts 39, 39, . . . , for alignment plate 31 support are erected, and the alignment plate 31 is fastened to the upper ends of these support posts 39, 39 . . .

The Y-axis moving mechanism 37 is provided integrally on the X-axis moving mechanism 36 and provides fine movement of the crimping table 32 in the Y direction, and comprises a pair of long guides 37a and 37a provided on a plate 36c along the Y-axis, a Y-axis moving mechanism 37b that provides a ball screw and a pulse motor, and a plate 37c that can make fine movements in the Y-axis direction due to the second Y-axis moving mechanism 37b and that can be fastened at a predetermined position. On the plate 37c, the crimping table 32, the θ-axis moving mechanism 33, and the Z-axis moving mechanism 34 described above are provided.

In this manner, while the alignment plate 31 is fastened by the support posts 39, 39, . . . , on the plate 36c of the X-axis moving mechanism 36, the crimping table 32, the θ-axis moving mechanism 33, and the Z-axis moving mechanism 34 are provided on the plate 37c of the second Y-axis moving mechanism 37, and thereby, there is no change in the upper surface position and the lower surface position of the alignment plate 31, and it is always possible to maintain them in a constant position. Therefore, by making this position an absolute position, it becomes possible for the crimping table 32 on the second Y-axis moving mechanism 37 to move freely in the Y-axis direction below the alignment plate 31.

As a result, the crimping table 32 on which the wafer is mounted does not interfere with the alignment plate 31.

As shown in FIG. 4, the bump ball crimping formation unit 4 comprises a side plate 41 erected vertically, a crimping plate 42 disposed horizontally in front of the side plate 41 and having a heater built in for heating, an ultrasonic oscillator 43 provided on the upper surface of the crimping plate 42, a Z-axis moving mechanism 44 that is provided on the front surface of the side plate 41 and can move the crimping plate 42 in the vertical direction (Z-axis direction) via the post 44a, and pressurization assistance air cylinders 45 and 45 provided on both sides of the Z-axis moving mechanism 44 for carrying out supplementary pressurization on the crimping plate 42.

Figure 5:
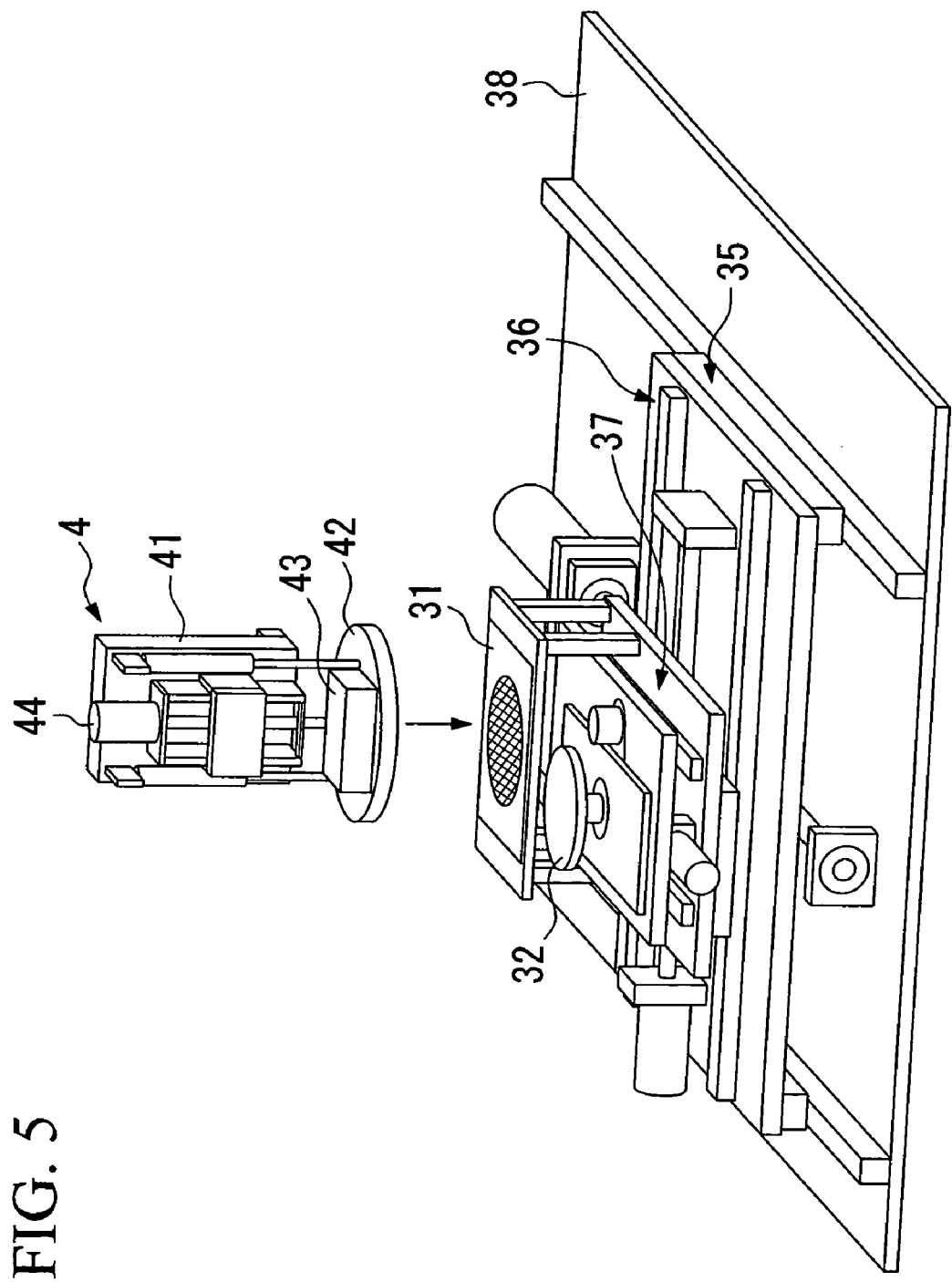
FIG. 5 is a perspective drawing showing the state after assembly of the bump ball crimping table unit and the bump ball crimping formation unit for an embodiment of the bump ball crimping apparatus of the present invention.

In addition, as shown in FIG. 1 and FIG. 5, a bump ball crimping formation unit 4 is installed on support posts or the like (not illustrated) of the bump ball crimping table unit 3, alignment is carried out by moving the alignment plate 31 of the bump ball crimping table unit 3, the crimping plate 42 pushed down by the Z-axis moving mechanism 44 and simultaneously pressurized and heated. Thereby, the bump balls aligned on the alignment plate 31 are crimped on the wafer surface.

The alignment unit 5 is for correctly adjusting the position and direction of the bonding pads of the wafer mounted on the crimping table 32 and the bump balls aligned on the alignment plate 31, and has mounted thereon a low magnification camera and a high magnification camera. Using these cameras, correct alignment is carried out by the operation of correctly detecting the position and direction of the bonding pads on the wafer and the bump balls aligned on the alignment plate 31, and the operation of moving the θ-axis moving mechanism 33 and the Z-axis moving mechanism 34 described above.

Figure 6:
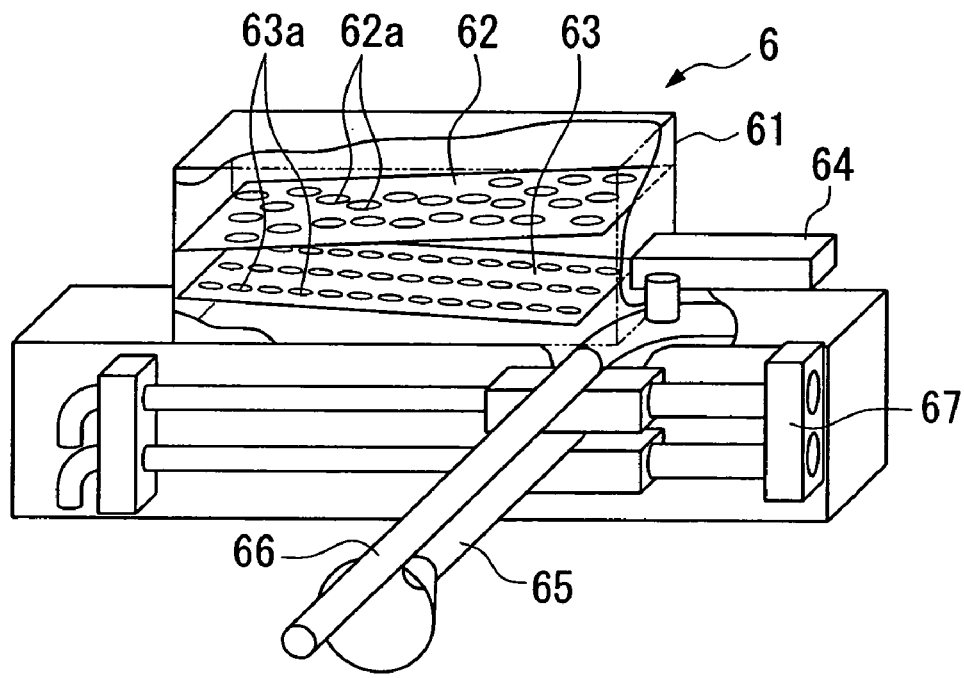
FIG. 6 is a partial sectional perspective drawing showing a bump ball feeding unit for an embodiment of the bump ball crimping apparatus of the present invention.
Figure 7:
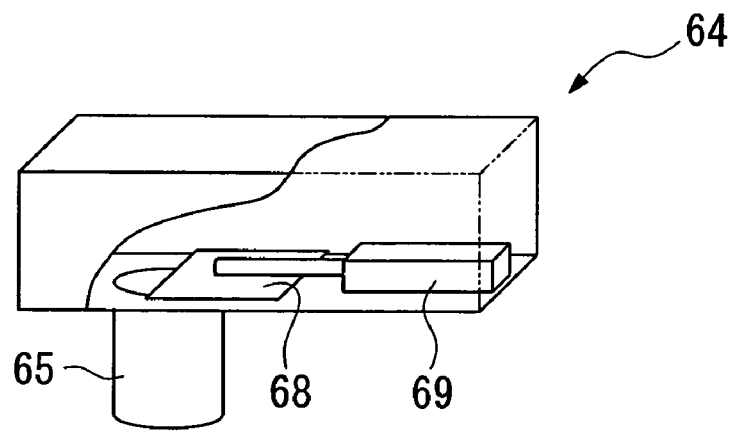
FIG. 7 is a partial sectional perspective drawing showing feeding part of the bump ball feeding unit for an embodiment of the bump ball crimping apparatus of the present invention.

As shown in FIG. 6, the bump ball feeding unit 6 comprises the box-shaped bump ball storage housing 61, the pair of grading plates 62 and 63 disposed at an inclination inside the bump ball storage housing 61, the conveyance unit 64, which is provided on the side surface of the bump ball storage housing 61 and temporarily stores and intermittently feeds bump balls graded by the grading plates 62 and 63, the bump ball injection bar 65 and the air blowing bar 66 for injecting the bump balls fed from the conveyance unit 64 onto the alignment plate 31, and the horizontal moving mechanism 67, which can separately move the bump ball injection bar 65 and the air blowing bar 66 in the axial direction (the direction along the longitudinal direction of the bump ball storage housing 61) and can fasten them at a predetermined position.

The grading plate 62 is a square plate that determines the upper limiting value of the outside diameter of the bump balls to be graded, and in order for a bump ball having an outside diameter equal to or less than the upper limiting value to pass through, grading holes 62a having a diameter exceeding the upper limiting value are formed irregularly in plurality. The diameter of these grading holes 62a, for example, is +5 μm for a bump diameter (D) of 50 μm.

This grading plate 62 is disposed such that the angle of inclination with respect to the horizontal surface is 1 to 3°.

The grading plate 63 is a square plate disposed below the grading plate 62 described above, and determines the lower limiting value of the outer diameter of the bump balls that have passed through the grading plate 62, and in order to make bump balls having an outer diameter less than the lower limiting value pass through, grading holes 63a having a diameter less than the lower limiting value are formed irregularly in plurality. The diameter of these grading holes 63a, for example, is −5 μm for a bump diameter (D) of 50 μm.

This grading plate 63 is disposed so as to incline in the direction opposite to that of the grading plate 62 and such that the angle of inclination with respect to the horizontal surface is 1 to 3°.

The feeding part 64 is connected to the bump ball injection bar 65 described above on the bottom surface of a box that is smaller than the bump ball storage housing 61, a shutter 68 for opening and closing the bump ball injection bar 65 is installed on the opening of the bump ball injection bar 65, and this shutter 68 can open and close freely due to the shutter opening and closing air cylinder 69.

In this bump ball feeding unit 6, the bump ball injection bar 65 and the air blowing bar 66 are both moved by the horizontal moving mechanism 67, and by opening and closing the shutter 68 by the shutter opening and closing air cylinder 69, the graded bump balls are injected and aligned on the alignment plate 31.

In order to prevent adhesion between bump balls due to static electricity, an antistatic device such as an ionizer can be provided on the distal end of the bump ball storage housing 61 or the bump ball injection bar 65. By providing this type of antistatic device, it becomes possible to prevent the charging of the bump balls with static electricity, and thereby it is possible to prevent the bump balls from adhering together.

Figure 8:
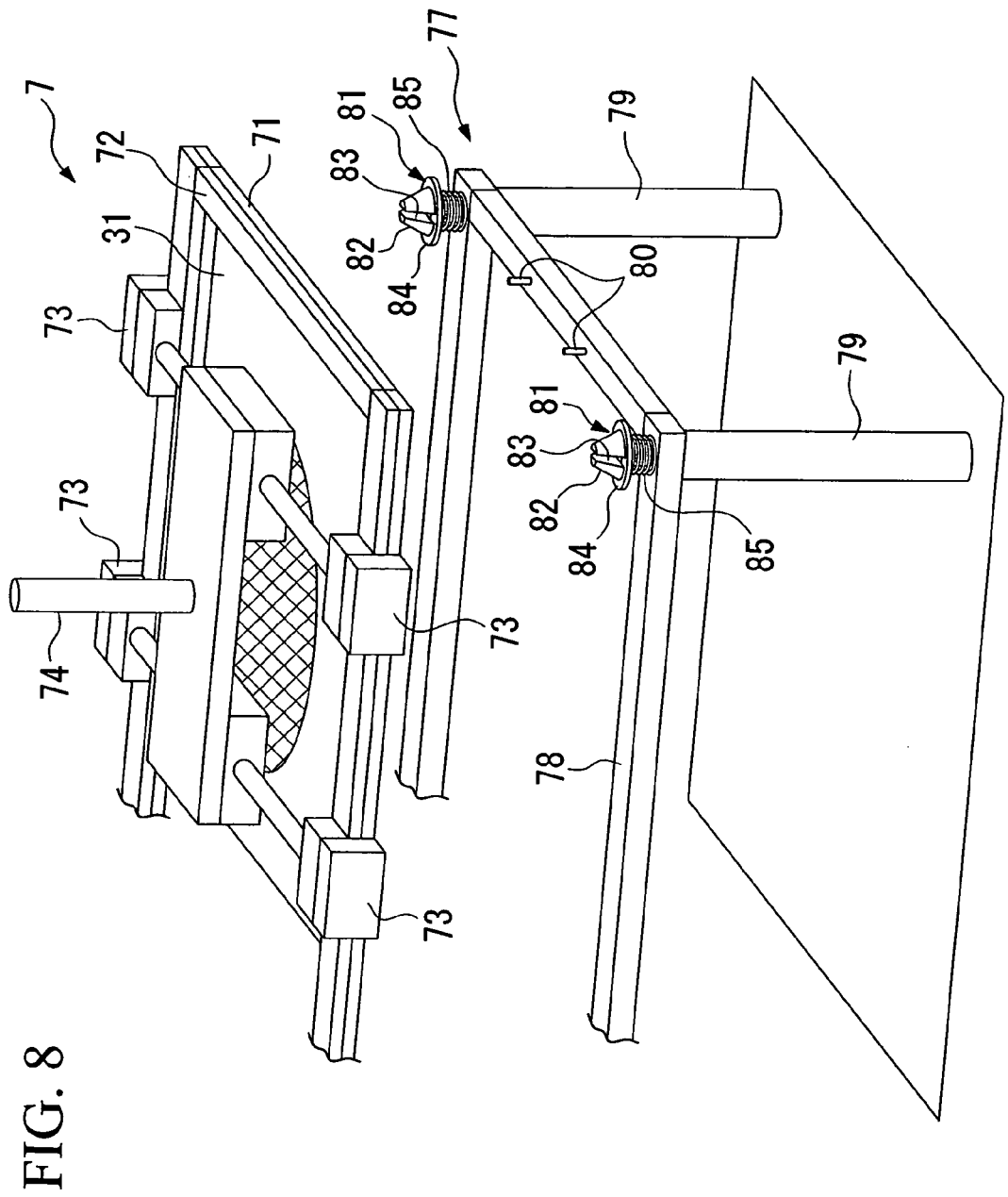
FIG. 8 is a perspective drawing showing the automatic bump ball alignment plate replacing unit for an embodiment of the bump ball crimping apparatus of the present invention.

The automatic bump ball alignment plate replacing unit 7 is for preventing unsatisfactory installation precision that occurs during replacement of the alignment plate 31 by automatically replacing the alignment plate 31, and as shown in FIG. 8, comprises an alignment plate frame 71 for square alignment plate support, an alignment plate frame 72 placed over this alignment plate frame 71 and having a shape identical to the alignment plate frame 71, a plurality of alignment plate clamp units 73 (in this case 4 units) that sandwich and fasten the overlaid alignment plate frames 71 and 72 and the horizontally disposed alignment plate 31 from the outside, and a Z-axis moving mechanism 74 that holds these alignment plate clamp units 73, 73, . . . , can move in the Z-axis direction (vertically), and can fasten them at a predetermined position.

Figure 9:
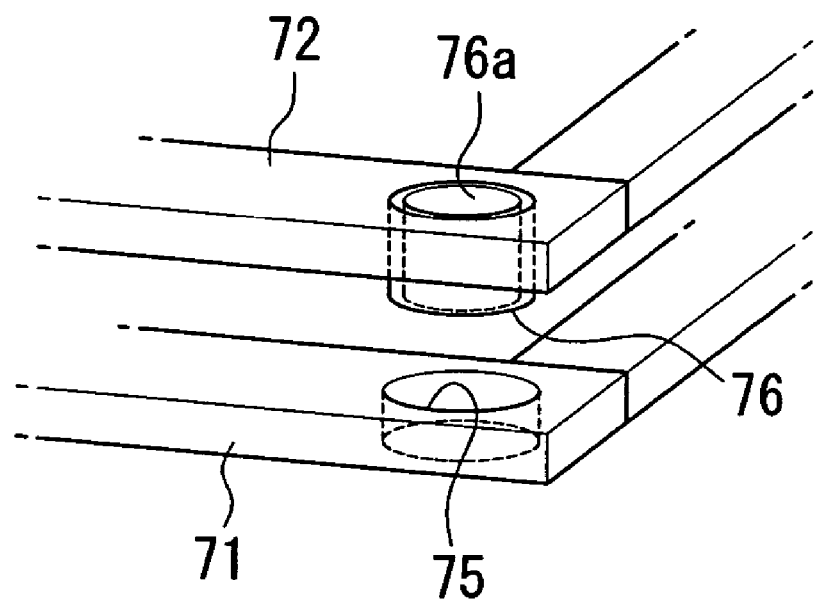
FIG. 9 is a perspective drawing showing the alignment plate frame of the automatic bump ball alignment plate replacing unit for an embodiment of the bump ball crimping apparatus of the present invention.

As shown in FIG. 9, holes 75 are formed in the four corners of the alignment plate frame 71 for the insertion of installation metal fittings described below, and cylindrical removal metal fittings 76 are provided at positions corresponding to the holes 75 on the four corners of the alignment plate frame 72. The diameter of the holes 76a for the removal metal fittings 76 is made smaller than the maximum diameter of the installation metal fittings 81.

In contrast, an installation table 77 for alignment plate 31 installation, which can move in the X direction due to the X-axis moving mechanism 36 of the bump ball crimping table unit 3, is disposed just under the alignment plate frame 71.

This installation plate 77 comprises a square frame 78 that has substantially the same shape as the alignment plate frames 71 and 72, and a plurality of support posts 79 (in this case, four support posts) that support this frame 78. On the surface of this frame 78, pins 80 and 80 for positioning the frames 71 and 72 during installation are provided, and installation metal fittings 81 are provided in the four corners.

In an installation fitting 81, a notch 83 is formed that is perpendicular to the metal fitting 82, whose outer diameter has an conical shape (a reverse fan shape in cross-section), an axle is provided on the same axis at the lower end this metal fitting body 82, and a washer 84 and a spring 85 is installed on this axle.

When the plates 71 and 72 are installed on this frame 78, installation is carried out by inserting the metal fittings bodies 82 of the installation fittings 82 into the holes 75, and the frames 71 and 72 are held by the washers 84 and springs 85.

In addition, when the frames 71 and 72 are removed from the frame 78, removal is carried out by using the removal metal fittings 76 to press the metal fitting body 82 of the installation metal fittings 81 upward and thereby contracting their diameter, and the metal fitting bodies 82 are extracted from the holes 75. Moreover, the installation table of the bump ball alignment plate storage housing 8 has the same specifications as this installation table 77.

In the automatic bump ball alignment plate replacing unit 7, the alignment plates 31 for each type of part are always stored beforehand in the bump ball alignment plate storage housing 8, an alignment plate 31 that corresponds to the type of wafer mounted on the crimping table 32 and the number and disposition of bonding pads for one chip is automatically selected, and the alignment plate 31 that is fastened at a predetermined position on the bump ball crimping table unit 3 and has become unnecessary is removed. At the same time, the necessary alignment plate 31 is removed from the bump ball alignment plate storage housing 8 and fastened at a predetermined position on the bump ball crimping table unit 3.

Next, the operation of the bump ball crimping apparatus will be explained.

The control unit 15 of the cassette set unit 1 is activated in advance, and the table 13 is moved to the uppermost position.

Here, when a wafer cassette storing a plurality of wafers with bumps is mounted (set) on the table 13, the control unit 15 is activated to lower the table 13. Thereby, the mounted wafer cassette is also lowered. In the meantime, the beam interruption sensor 14 detects the arrangement and number of wafers in the wafer cassette. Subsequently, the table 13 is raised again and stopped such that the bottommost wafer stored in the wafer cassette is at a predetermined position.

Next, the wafer conveyance unit 2 is activated, the desired wafer in the wafer cassette is held by suction due to the conveyance arm 26, and this wafer is extracted from the wafer cassette and conveyed onto center chuck table 25. Then, the center chuck table 25 is raised, and the wafer held by suction on the conveyance arm 26 is held by suction. Next, at the same time that this wafer is rotated, the notch or orientation flat position of the wafer is detected by the detecting sensor 28, and the notch or orientation flat position is aligned at a predetermined position.

In the meantime, beforehand the crimping table 32 of the bump ball crimping table unit 3 is moved and held at the wafer receiving position.

Next, the center chuck table 25 is lowered and the wafer is held by suction by the conveyance arm 26, and this wafer is conveyed onto the crimping table 32 that is being held at the wafer receiving position, and mounted on the crimping table 32.

Next, adjustment of the wafer mounted on the crimping table 32 in the θ direction is carried out.

First, the crimping table 32 on which the wafer is mounted is moved directly below the alignment unit 5, and the adjustment of the wafer in the θ direction is carried out using the low magnification camera and the high magnification camera. At this time, the wafer is moved in the Z direction by activating the Z-axis moving mechanism 34 of the bump ball crimping table unit 3, and the focus point of the wafer is adjusted. Next, the wafer is rotated by activating the θ-axis moving mechanism 33, and the wafer 5 is adjusted in the θ direction. In this case, it is possible to find the thickness of the wafer by measuring the focal point position of the wafer by using the surface of the crimping table 32 as a reference.

After this adjustment in the θ direction, the crimping table 32 is returned to the reference position, then moved directly under the alignment plate 31 and the crimping table 32 is raised so that the gap between the upper surface of the crimping table 32 and the lower surface of the alignment plate 31 is 5 to 10 $\mu$m.

Subsequently, the crimping table 32 is again moved directly below the alignment unit 5, and the fine position adjustment between the position of the alignment holes of the alignment plate 31 and the position of the bonding pads on the wafer is carried out.

After the fine position adjustment, the alignment plate 31 is moved to a predetermined position and held.

Next, using the bump ball feeding unit 6, the bump balls that have been graded by the grading plates 62 and 63 are injected on the waiting alignment plate 31, and the bump balls are fed to each of the alignment holes of the alignment plate 31.

Next, the grading method of the bump balls will be explained.

First, a pair of grading plates 62 and 63 that match the specified values of the outer diameter of the used bump balls is selected. For example, when using bump balls having a bump diameter (D) of 50 $\mu$m, the diameter of the grading holes 62a of the grading plate 62 is 55 $\mu$m, and the diameter of the grading holes 63a of the grading plate 63 is 45 $\mu$m.

Next, these grading plates 62 and 63 are disposed into the bump ball storage housing 61 so that their angle of inclination is 1 to 3° and such that their angles of inclination are in different directions.

Here, when the bump balls are injected into the bump ball storage housing 61, the bump balls are graded so as to be within the desired bump ball range while tumbling over each of the grading plates 62 and 63 due to the angle of inclination between each of the grading plates 62 and 63 and the bump balls own weight. At the same time, bump balls that are outside the standard remain above the grading plate 62 and below the grading plate 63.

The bump balls graded by the grading plates 62 and 63 are injected and aligned on the alignment plate 31 by the bump ball injection bar 65 by activating the shutter opening and closing air cylinder 69 of the conveyance unit 64 and intermittently opening and closing the shutter 68. Subsequently, the alignment plate 31 is moved to a chip block (not illustrated) for each crimping table 32, and the burying of all the bump balls in all the alignment holes of the alignment plate 31 is confirmed using the detecting device.

Next, the alignment plate 31 and the crimping table 32 are moved directly below the crimping plate 42 of the bump ball crimping formation unit 4, the crimping plate 42 is lowered to the upper surface of the alignment plate 31 by the Z-axis moving mechanism 44 and the pressurization assistance air cylinders 45 and 45, and due to being pressurized, the bump balls are crimped onto the bonding pads.

In the case that the absolute distance between the lower surface of the alignment plate 31 and the upper surface of the crimping plate 42 is set at 2000 μm and in the case that the thickness of the wafer found by the measured value of the focal point position of the wafer during alignment of the wafer is, for example, 725 μm, the distance that the crimping plate 42 can move vertically is equal to the "absolute distance"–"wafer thickness", that is, 2000–725=1275 μm. 1275 μm becomes the distance between the lower surface of the crimping plate 42 and the upper surface of the alignment plate 31, and is the distance that the crimping plate 42 can move in the vertical direction.

At the same time, in order to carry out positioning between the alignment holes of the alignment plate 31 and the bonding pads of the wafer on the crimping table 32, a gap of 5 to 10 μm between the alignment plate 31 and the crimping table 32 becomes necessary. Taking this into consideration, the distance that the crimping plate 42 can move in the vertical direction becomes 1265 to 1270 μm.

Thereby, fine position adjustment can be carried out without the alignment plate 31 and the crimping table 32 coming into contact.

When pressurized by the crimping plate 42, for example, in the case that the maximum diameter of the bump balls is 50 μm and the thickness of the alignment plate 31 is 25 to 30 μm, the difference between the maximum diameter of the bump balls and the thickness of the alignment plate 31 is 20 to 25 μm. In contrast, the upper surface of the crimping table 32 is 5 to 10 μm below the lower surface of the alignment plate 31, and thus the downward pressure is maximally applied to the bump balls while lowering the crimping plate 42, and stress is applied to the wafer by the pressure applied to the bump balls. In order to relieve the stress applied to the wafer, it is necessary to lower the crimping table 32 again 5 to 10 μm.

After bump ball crimping, the crimping table 32 is lowered to the original position, and at the same time the crimping plate 42 is raised to the original position.

After lowering, the crimping table 32 is moved from the alignment plate 31, returns to a predetermined position in order to release the wafer, and the wafer suction hold is released. Subsequently, the crimping table 32 is further lowered or the 3 pin wafer transport unit is raised, and while the wafer is recovered by the recovery arm 27, the wafer to be processed next is conveyed by the conveyance arm 26, mounted on the 3 pin wafer transport unit, and the crimping of the bump balls is repeated.

After completion of the operations described above, when it becomes necessary to replace the alignment plate 31, an alignment plate 31 corresponding to the type of wafer and the number and disposition of the bonding pads for each chip is automatically selected, the alignment plate 31 is removed from the bump ball alignment plate storage housing 8, the Z-axis moving mechanism 74 is allowed to move, and the alignment plate frames 71 and 72 fastened by the alignment plate clamp units 73, 73, . . . , are lowered.

Subsequently, the upper surface of the frame of the alignment plate 31 is sensed by microswitches (not illustrated) provided on the four corners of the aligning plate frame 71, the lowering of the Z-axis moving mechanism 74 is stopped, and at the same time, the alignment plate 31 and the alignment plate frames 71 and 72 are clamped by the alignment plate clamp units 73, 73, . . . , the alignment plate frames 71 and 72 and the alignment plate 31 are raised and held by the alignment plate clamp units 73, 73, . . . , by allowing the Z-axis moving mechanism 74 to move.

Subsequently, the installation table 77 is moved directly below the aligning plate frame 71 by moving the X-axis moving mechanism 36 of the bump ball crimping table unit 3.

After the moving of the installation table 77 has completed, the alignment plate frames 71 and 72 and the alignment plate 31 fastened by the alignment plate clamp units 73, 73, . . . , are lowered by allowing the Z-axis moving mechanism 74 to move, and the alignment plate 31 is set on the installation table 77. Here, positioning of the installation table 77 and the alignment plate frames 71 and 72 is carried out by the pins 80 and 80.

Subsequently, the alignment plate frames 71 and 72 are lowered by allowing the Z-axis moving mechanism 74 to move again, and they are held at a predetermined position.

As explained in detail above, according to the bump ball crimping apparatus of the present embodiment, the Y-axis moving mechanism 35 and the X-axis moving mechanism 36 that can move the alignment plate 31 in the Y-axis direction and the X-axis direction perpendicular to the planar surface and that can fasten it at a predetermined position, and the second Y-axis moving mechanism 37 that can move the crimping table 32 in the Y-axis direction and fasten it at a predetermined position are provided, and thereby it is possible to move the crimping table 32 while the alignment plate 31 is fastened, it is possible to carry out positioning between the alignment holes of the alignment plate 31 and the bonding pads of the wafer on the crimping table 32 easily, and it is possible to carry out adjustments between the alignment plate 31 and the crimping table 32 easily. Therefore, the crimping table 32 on which the wafer is mounted does not interfere with the alignment plate 31 and can carry out crimping of the bump balls simultaneously irrespective of the number of bonding pads.

In addition, the second Y-axis moving mechanism 37 is integrally provided on the X-axis moving mechanism 36, and thus it is always possible to guarantee a constant position for the alignment plate 31 fastened by the X-axis moving mechanism 36 and the crimping table 32 fastened by the second Y-axis moving mechanism 37. Therefore, by making this position an absolute position, it is possible to move the crimping table 32 of the second Y-axis moving mechanism 37 freely in the Y-axis direction below the alignment plate 31, and as a result, the crimping table 32 on which the wafer is mounted can be moved without interfering with the alignment plate 31.

In addition, using the automatic bump ball alignment plate replacing unit 7, the alignment plate 31 can be automatically replaced, and thus it is possible to prevent insufficient alignment precision that occurs during the replacement of the alignment plate 31, and it is thus possible to improve the accuracy of the alignment plate 31 along the top plane.

In addition, if the movement stroke of the second Y-axis moving mechanism 37 is made shorter than the movement stroke of the (first) Y-axis moving mechanism 35, it is possible to shorten the movement stroke of the driving apparatus of the second Y-axis moving mechanism 37 (for example, an air pressure cylinder). Additionally, the drive force required by the second Y-axis moving mechanism 37 can be made smaller than that of the Y-axis moving mechanism 35, and thus the positioning precision of the second Y-axis moving mechanism 37 can be increased, and it is possible to position the sample table more correctly with respect to the alignment tool.

Above, an embodiment of the bump ball crimping apparatus of the present invention was explained with reference to the figures, but the concrete structure of the embodiment is not limited thereby. Design modifications and the like are possible within a range that does not depart from the spirit of the present invention.

For example, in the embodiment described above, a structure was described wherein the second Y-axis moving mechanism 37 was provided in order to allow movement of the crimping table 32 in the Y-axis direction, but the second Y-axis moving mechanism 37 can be any mechanism that moves the crimping table 32 in one direction over a plane. Instead of this second Y-axis moving mechanism, a second X-axis moving mechanism could be provided.

What is claimed is:

1. A bump ball crimping apparatus comprising an alignment tool for aligning a plurality of bump balls; a sample table disposed below said alignment tool for mounting the plate-shaped samples on which said bump balls are to be crimped; a crimping mechanism disposed above said alignment tool for crimping said bump balls to said plate-shaped samples; and a first moving mechanism disposed below said alignment tool and said sample table that can move said alignment tool in two mutually perpendicular directions on a plane, and can fasten it at a predetermined position, wherein:

a second moving mechanism that supports said sample table such that it can move in at least one direction over the plane parallel to said two directions, and can be fastened at a predetermined position.

2. A bump ball crimping apparatus according to claim 1, wherein said second moving mechanism supports said sample table such that it can move at least in one of said two directions and can be fastened at a predetermined position.

3. A bump ball crimping apparatus according to claim 2, wherein said second moving mechanism is fastened on said first moving mechanism.

4. A bump ball crimping apparatus according to claim 2, wherein the length of the range of movement of said second moving mechanism is made smaller than the length of the range of movement of said first moving mechanism in the same direction as said second moving mechanism.

5. A bump ball crimping apparatus according to claim 3, comprising a supply device for supplying said bump balls to said alignment tool.

6. A bump ball crimping apparatus according to claim 5, comprising a detecting device for detecting that the plurality of said bump balls is aligned on said alignment tool.

7. A bump ball crimping apparatus according to claim 6, comprising an alignment tool replacing device that automatically replaces said alignment tool.

8. A bump ball crimping apparatus according to claim 7, wherein said second moving mechanism moves said sample table between a position overlapping the alignment tool from a horizontal view and a position that does not overlap said alignment tool from a horizontal view.

9. A bump ball crimping apparatus according to claim 8, wherein the length of the range of movement of said second moving mechanism is made smaller than the length of the range of movement of said first moving mechanism in the same direction as said second moving mechanism.

10. A bump ball crimping apparatus according to claim 1, wherein said second moving mechanism is fastened on said first moving mechanism.

11. A bump ball crimping apparatus according to claim 1, comprising a supply device for supplying said bump balls to said alignment tool.

12. A bump ball crimping apparatus according to claim 1, comprising a detecting device for detecting that the plurality of said bump balls is aligned on said alignment tool.

13. A bump ball crimping apparatus according to claim 1, comprising an alignment tool replacing device that automatically replaces said alignment tool.

14. A bump ball crimping apparatus according to claim 1, wherein said second moving mechanism moves said sample table between a position overlapping the alignment tool from a horizontal view and a position that does not overlap said alignment tool from a horizontal view.

* * * * *